(12) United States Patent
Kim et al.

(10) Patent No.: US 9,341,743 B2
(45) Date of Patent: May 17, 2016

(54) PHOTOSENSITIVE RESIN COMPOSITION FOR COLOR FILTER, AND COLOR FILTER PREPARED USING THE SAME

(71) Applicant: Cheil Industries Inc., Gumi-si (KR)

(72) Inventors: Seung Hyun Kim, Uiwang-si (KR); Dong Hoon Won, Uiwang-si (KR); Myoung Youp Shin, Uiwang-si (KR); Hwan Sung Cheon, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/307,590

(22) Filed: Jun. 18, 2014

(65) Prior Publication Data

US 2015/0053900 A1 Feb. 26, 2015

(30) Foreign Application Priority Data

Aug. 21, 2013 (KR) .......................... 10-2013-0099322

(51) Int. Cl.
| | | |
|---|---|---|
| G02B 5/23 | (2006.01) | |
| G02B 5/22 | (2006.01) | |
| G02B 1/04 | (2006.01) | |
| G03F 7/004 | (2006.01) | |
| G03F 1/00 | (2012.01) | |
| G03C 1/00 | (2006.01) | |
| G03F 7/00 | (2006.01) | |
| C09B 62/00 | (2006.01) | |

(52) U.S. Cl.
CPC .............. *G02B 1/04* (2013.01); *G02B 5/223* (2013.01); *G03F 7/0045* (2013.01)

(58) Field of Classification Search
USPC ........ 252/582, 586; 257/432; 359/891; 430/7, 430/270.1, 281.1, 285.1, 286.1, 434; 552/101; 540/122, 130
See application file for complete search history.

(56) References Cited

U.S. PATENT DOCUMENTS

| | | | |
|---|---|---|---|
| 5,811,209 A | 9/1998 | Eida et al. | |
| 5,968,688 A * | 10/1999 | Masuda | ..................... C09B 1/32 430/270.1 |
| 7,910,272 B2 * | 3/2011 | Takakuwa | ............. G03F 7/0007 430/270.1 |
| 2006/0051685 A1 * | 3/2006 | Fujimori et al. | .................. 430/7 |
| 2008/0020300 A1 * | 1/2008 | Lee et al. | ........................ 430/7 |

FOREIGN PATENT DOCUMENTS

KR    1996-0011513 B1    9/1999

* cited by examiner

*Primary Examiner* — Bijan Ahvazi
(74) *Attorney, Agent, or Firm* — Additon, Higgins & Pendleton, P.A.

(57) ABSTRACT

The present invention relates to a phthalocyanine compound represented by Formula 1, a dye including the same, a photosensitive resin composition including the same, and a color filter prepared using the same. In Formula 1, $Z_1$ to $Z_{16}$ and $M_1$ are the same as defined in the specification, wherein 1 to 8 of $Z_1$ to $Z_{16}$ are substituted with one of Formulae 2 to 5, as also defined in the specification. The phthalocyanine compound can have high luminance, high contrast, and excellent heat resistance.

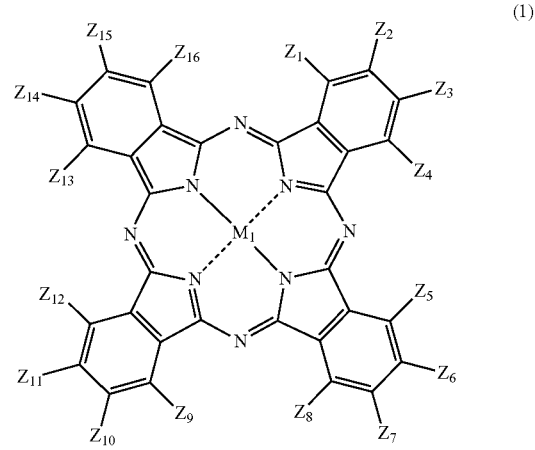

(1)

13 Claims, No Drawings

PHOTOSENSITIVE RESIN COMPOSITION FOR COLOR FILTER, AND COLOR FILTER PREPARED USING THE SAME

CROSS-REFERENCE TO RELATED APPLICATION

This application claims priority under 35 USC Section 119 to and the benefit of Korean Patent Application No. 10-2013-0099322, filed Aug. 21, 2013, the entire disclosure of which is incorporated herein by reference.

FIELD OF THE INVENTION

The present invention relates to a photosensitive resin composition for color filters and a color filter prepared using the same.

BACKGROUND OF THE INVENTION

Color filters are generally used in liquid crystal displays, optical filters of cameras, and the like. Color filters can be prepared by coating a minute area with three or more colors onto a solid state imaging device or a transparent substrate. Such colored thin films are typically formed by dyeing, printing, electrodeposition, pigment dispersion, ink-jet printing, and the like. Currently, such methods are applied to production of LCDs, such as those used in mobile phones, notebook computers, monitors, TVs, and the like.

In the dyeing method, a colored thin film may be produced by forming an image having a dyeing matrix, such as natural photosensitive resins like gelatin, amine modified polyvinyl alcohols, amine modified acrylic binder resins, and the like, on a glass substrate, followed by dyeing with direct dyes. In order to form a multi-colored thin film on the same substrate, it is necessary to perform flame retardant finishing whenever the color changes, thereby complicating the production process and delaying production time. Although general dyes and resins per se have good clarity and dispersibility, these dyes and resins have drawbacks in that they have poor light resistance, moisture resistance, and heat resistance, which is the most important property.

In the printing method, a colored thin film may be produced by printing an ink wherein a pigment is dispersed in a thermosetting or photocurable resin, followed by curing these components with heat or light. This method may reduce material costs as compared to other methods. However, the method has drawbacks in that it is difficult to form a highly defined and minute image, and the formed thin layers are not uniform.

Korean Patent Publication No. 1996-0011513A discloses a method for producing a color filter by ink jet printing. However, this method can result in deteriorated durability and heat resistance like the dyeing method since a colored photosensitive resin composition to be injected from a nozzle to print a minute and defined color is prepared in dye form.

In the pigment dispersion method, a colored thin film is produced by repeating a series of steps including: coating a photopolymerizable composition containing a colorant on a transparent substrate on which a black matrix is provided, exposing the composition to light in a desired pattern, removing the unexposed portion with a solvent, and heat curing. The pigment dispersion method can enhance heat resistance and durability and can maintain the thickness of films uniformly.

As a pigment for a color filter in the pigment dispersion method, C.I. Pigment Green, C.I. Pigment Yellow, C.I. Pigment Blue, C.I. Pigment Violet, and the like essentially consisting of phthalocyanine pigments are used in combination. However, in this case, atomization of the pigments may limit luminance and contrast owing to pigment particle size. As a method for additionally improving color properties, it is necessary to introduce a highly durable dye having no particulate property in a molten state or a very small primary particle diameter of not more than several nanometers.

In general, although there has been extensive research directed to color filters including dyes, it is difficult to provide both excellent light transmission and excellent absorption capabilities in a desired color range. Further, dyes satisfying high contrast together with basic reliability for use in color filters are very rare.

SUMMARY OF THE INVENTION

The present invention provides a photosensitive resin composition that can ensure high luminance and/or high contrast and can provide excellent heat resistance.

The present invention further provides a color filter prepared using the photosensitive resin composition.

The photosensitive resin composition includes: (A) a colorant including a dye represented by Formula 1; (B) an acrylic binder resin; (C) a photopolymerizable compound; (D) a photoinitiator; and (E) a solvent:

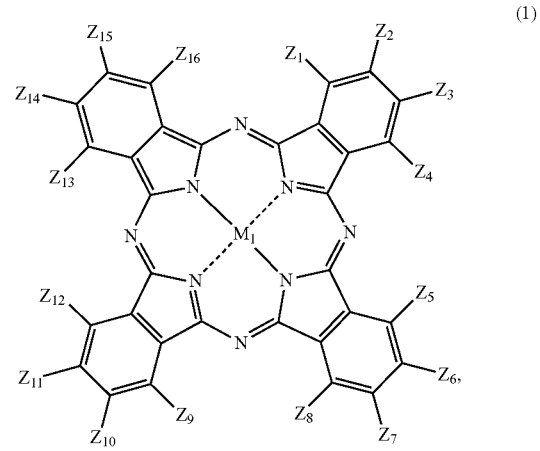

wherein $Z_1$ to $Z_{16}$ are the same or different and are each independently hydrogen, fluorine, chlorine, or one of Formulae 2 to 5, provided that 1 to 8 of $Z_1$ to $Z_{16}$ are substituted with one of Formulae 2 to 5 or a combination thereof; and $M_1$ is Zn, Mg, Ca, Sr, Ba, Mn, Co, Ni, Pd, Pt, Sn, Fe, InCl, or VCl,

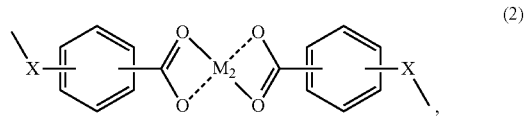

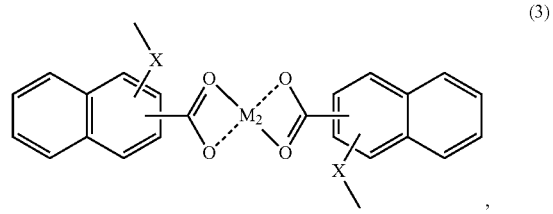

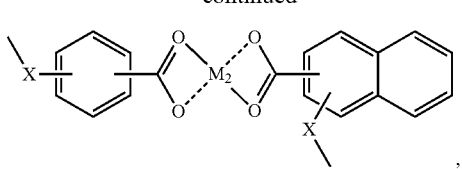

(4)

wherein each X is the same or different and is each independently oxygen (O), sulfur (S) or sulfone (—$SO_2$—); and $M_2$ is Zn, Mg, Ca, Sr, Ba, Mn, Co, Ni, Pd, Pt, Sn, Fe, InCl, or VCl,

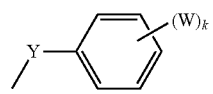

(5)

wherein Y is oxygen (O), sulfur (S) or sulfone (—$SO_2$—); each W is the same or different and each is independently substituted or unsubstituted $C_1$ to $C_{20}$ alkyl, substituted or unsubstituted $C_2$ to $C_{20}$ alkenyl, substituted or unsubstituted $C_3$ to $C_{20}$ alkynyl, substituted or unsubstituted $C_3$ to $C_{30}$ cycloalkyl, substituted or unsubstituted $C_3$ to $C_{30}$ cycloalkenyl, substituted or unsubstituted $C_6$ to $C_{30}$ cycloalkynyl, or substituted or unsubstituted $C_6$ to $C_{30}$ aryl; and k is 1 to 5.

The photosensitive resin composition may include (A) about 0.1 wt % to about 30 wt % of the colorant; (B) about 1 wt % to about 20 wt % of the acrylic binder resin; (C) about 1 wt % to about 20 wt % of the photopolymerizable compound; (D) about 0.1 wt % to about 5 wt % of the photoinitiator; and (E) the balance of the solvent.

The colorant (A) may further include at least one pigment selected from among green pigments and/or yellow pigments in addition to the dye represented by Formula 1.

The colorant (A) may include the dye represented by Formula 1 and the pigment in a weight ratio of about 9:1 to about 1:9.

The acrylic binder resin (B) may be a copolymer of a first ethylenic unsaturated monomer having at least one carboxyl group and a second ethylenic unsaturated monomer copolymerizable therewith.

The acrylic binder resin (B) may have a weight average molecular weight (Mw) ranging from about 3,000 g/mol to about 150,000 g/mol.

The acrylic binder resin (B) may have an acid value ranging from about 15 mg KOH/g to about 60 mg KOH/g.

The photopolymerizable compound (C) may include at least one selected from among ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenol A diacrylate, trimethylol propane triacrylate, novolac epoxy acrylate, ethylene glycol dimethacrylate, diethylene glycol dimethacrylate, triethylene glycol dimethacrylate, propylene glycol dimethacrylate, 1,4-butanediol dimethacrylate, and/or 1,6-hexanediol dimethacrylate.

The photoinitiator (D) may include at least one selected from among triazine compounds, acetophenone compounds, benzophenone compounds, thioxanthone compounds, benzoin compounds, and/or oxime compounds.

The photosensitive resin composition may further include at least one additive selected from the group consisting of dispersants, coating improvers, adhesion promoters, silane coupling agents, leveling agents, surfactants, and polymerization initiators.

The present invention also relates to a color filter including the photosensitive resin composition.

The present invention may provide a photosensitive resin composition having high luminance, high contrast and/or excellent heat resistance, and a color filter prepared using the same.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

A photosensitive resin composition according to one embodiment of the present invention includes (A) a colorant including a dye represented by Formula 1; (B) an acrylic binder resin; (C) a photopolymerizable compound; (D) a photoinitiator; and (E) a solvent.

Hereinafter, each component of the photosensitive resin composition of the embodiment of the invention will be described in detail.

(A) Colorant

The colorant according to the present invention may include a dye represented by Formula 1:

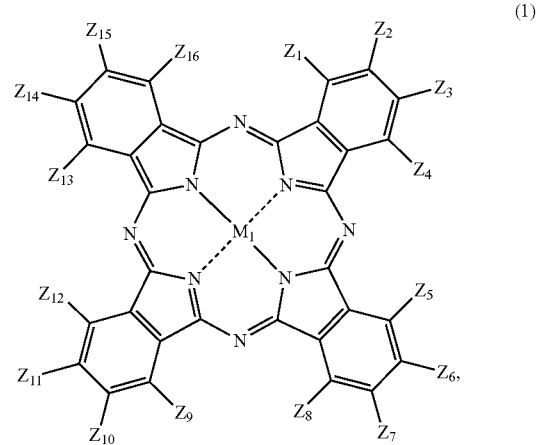

(1)

wherein $Z_1$ to $Z_{16}$ are the same or different and are each independently hydrogen, fluorine, chlorine, or one of Formulae 2 to 5, provided that 1 to 8 of $Z_1$ to $Z_{16}$ are substituted with one of Formulae 2 to 5 or a combination thereof; and $M_1$ is Zn, Mg, Ca, Sr, Ba, Mn, Co, Ni, Pd, Pt, Sn, Fe, InCl, or VCl,

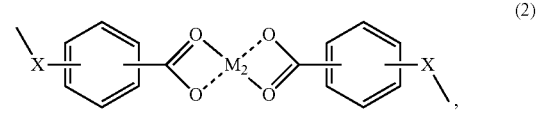

(2)

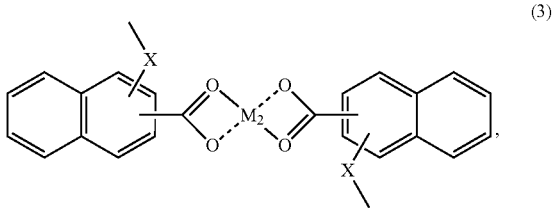

(3)

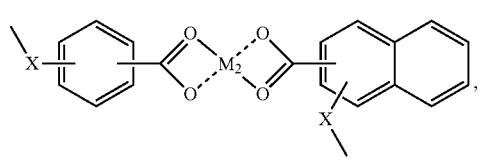

(4)

wherein each X is the same or different and is each independently oxygen (O), sulfur (S) or sulfone (—SO$_2$—); and M$_2$ is Zn, Mg, Ca, Sr, Ba, Mn, Co, Ni, Pd, Pt, Sn, Fe, InCl, or VCl,

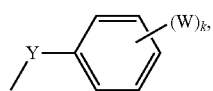

(5)

wherein Y is oxygen (O), sulfur (S) or sulfone (—SO$_2$—); each W is the same or different and is each independently substituted or unsubstituted C$_1$ to C$_{20}$ alkyl, substituted or unsubstituted C$_2$ to C$_{20}$ alkenyl, substituted or unsubstituted C$_3$ to C$_{30}$ alkynyl, substituted or unsubstituted C$_3$ to C$_{30}$ cycloalkyl, substituted or unsubstituted C$_3$ to C$_{30}$ cycloalkenyl, substituted or unsubstituted C$_6$ to C$_{30}$ cycloalkynyl, or substituted or unsubstituted C$_6$ to C$_{30}$ aryl; and k is 1 to 5.

As used herein, the term "substituted" means that a hydrogen atom of a compound is substituted with a substituent such as halogen (F, Cl, Br and I), hydroxyl, nitro, cyano, amino, azido, amidino, hydrazine, hydrazono, carbonyl, carbamyl, thiol, ester, carboxyl or a salt thereof, sulfonic acid or a salt thereof, phosphoric acid or a salt thereof, C$_1$ to C$_{20}$ alkyl, C$_2$ to C$_{20}$ alkenyl, C$_2$ to C$_{20}$ alkynyl, C$_1$ to C$_{20}$ alkoxy, C$_6$ to C$_{30}$ aryl, C$_6$ to C$_{30}$ aryloxy, C$_3$ to C$_{30}$ cycloalkyl, C$_3$ to C$_{30}$ cycloalkenyl, C$_3$ to C$_{30}$ cycloalkynyl, or a combination thereof.

Examples of the dye represented by Formula 1 may include compounds represented by Formulae 6 and/or 7.

(6)
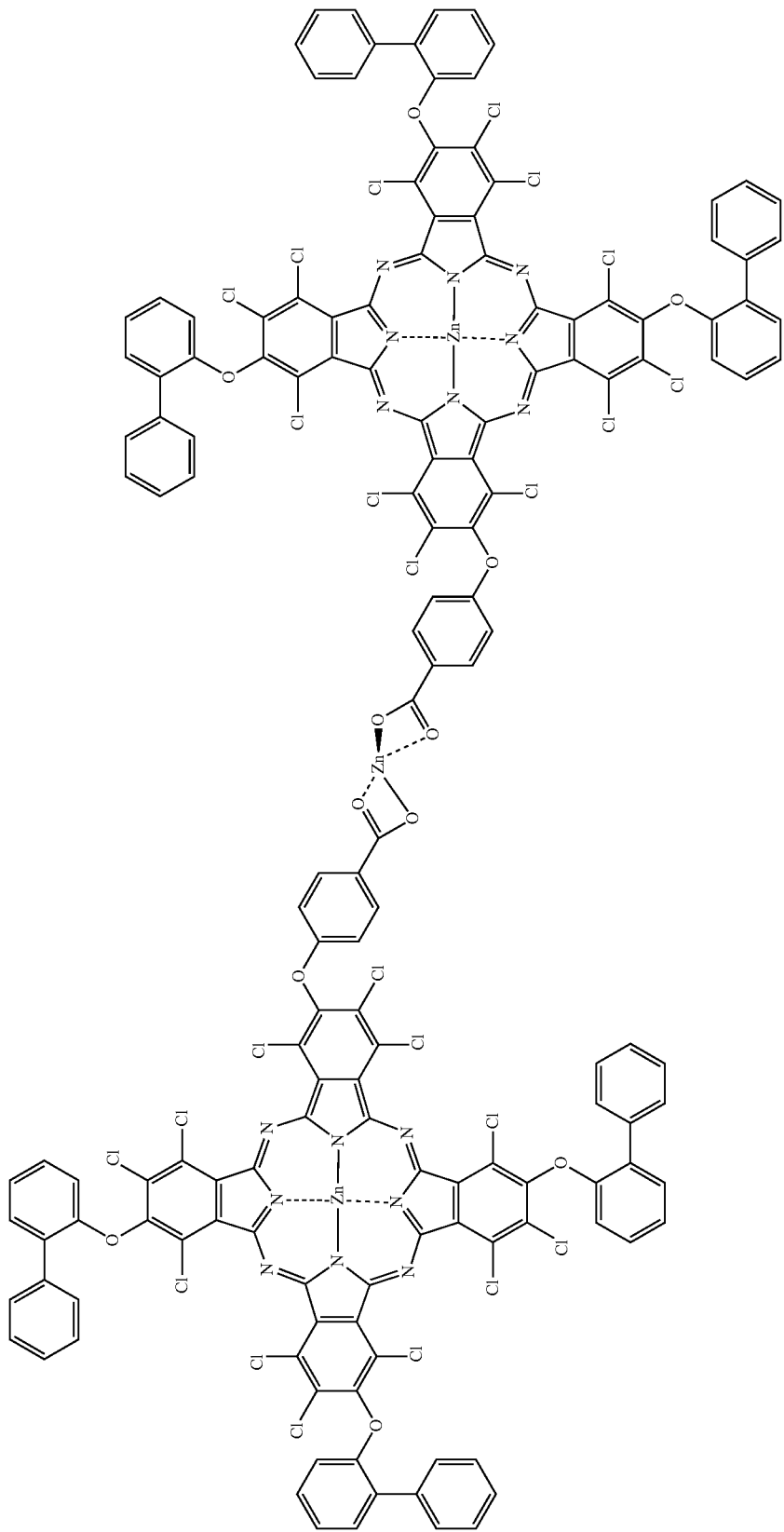

(7)
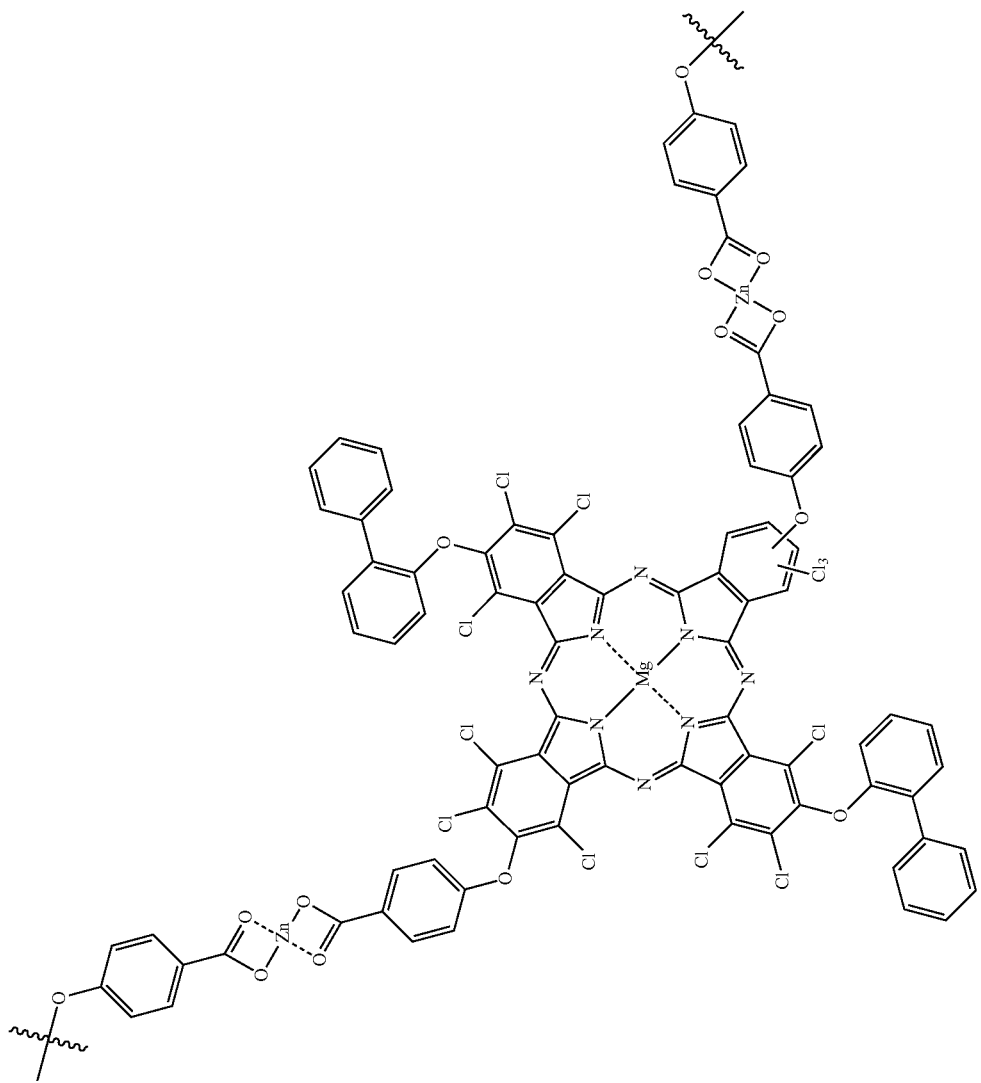
-continued

The colorant may further include at least one pigment selected from among green pigments and/or yellow pigments in addition to the compound represented by Formula 1.

Examples of the green pigment may include without limitation phthalocyanine pigments, such as C.I. Pigment 7, C.I. Pigment Green 36, C.I. Pigment Green 58, and the like, and combinations thereof.

Examples of the yellow pigment may include without limitation isoindoline pigments, such as C.I. Pigment Yellow 139 and the like, quinophthalone pigments, such as C.I. Pigment Yellow 138, and the like, nickel complex pigments, such as C.I. Pigment Yellow 150, and the like, and combinations thereof.

The pigment may be used together with a dispersant(s) so as to be sufficiently dispersed in the photosensitive resin composition. For example, the pigment may be pre-surface treated with a dispersant(s), or a pigment dispersion including the pigment together with a dispersant(s) may be added upon preparation of the photosensitive resin composition.

Examples of the dispersants may include without limitation nonionic dispersants, anionic dispersants, cationic dispersants, and the like and combinations thereof. Examples of the dispersants may include without limitation polyalkylene glycols and esters thereof, polyoxyalkylenes, polyhydric alcohol ester alkylene oxide adducts, alcohol alkylene oxide adducts, sulfonic acid esters, sulfonic acid salts, carboxylic acid esters, carboxylic acid salts, alkylamide alkylene oxide adducts, alkyl amines, and the like. These may be used alone or in combination of two or more thereof.

When the colorant includes a pigment and the dye represented by Formula 1, the dye and the pigment can be present in a weight ratio of about 9:1 to about 1:9, for example about 3:7 to about 7:3.

In some embodiments, the combination or mixture of the dye represented by Formula 1 and the pigment may include the dye represented by Formula 1 in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the dye represented by Formula 1 can be in a range from about any of the foregoing amounts to about any other of the foregoing amounts.

In some embodiments, the combination or mixture of the dye represented by Formula 1 and the pigment may include the pigment in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the pigment can be in a range from about any of the foregoing amounts to about any other of the foregoing amounts.

In the present invention, the photosensitive resin composition may include the colorant in an amount of about 0.1 wt % to about 30 wt %, for example about 0.5 wt % to about 20 wt %, based on the total weight (100 wt %) of the photosensitive resin composition. In some embodiments, the photosensitive resin composition may include the colorant in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the colorant can be in a range from about any of the foregoing amounts to about any other of the foregoing amounts.

Within this range of the colorant, the composition can exhibit high contrast and/or high luminance at desired color coordinates while providing excellent heat resistance.

(B) Acrylic Binder Resin

The acrylic binder resin is a copolymer of a first ethylenic unsaturated monomer and a second ethylenic unsaturated monomer copolymerizable therewith, and includes at least one acrylic repeat unit.

The first ethylenic unsaturated monomer may include at least one carboxyl group. Examples of the first ethylenic unsaturated monomer may include without limitation acrylic acid, methacrylic acid, maleic acid, itaconic acid, fumaric acid, and the like, and combinations thereof.

The acrylic binder resin may include the first ethylenic unsaturated monomer in an amount of about 5 wt % to about 50 wt %, for example about 10 wt % to about 40 wt %, based on the total weight (100 wt %) of the acrylic binder resin.

Examples of the second ethylenic unsaturated monomer may include without limitation alkenyl aromatic monomers, unsaturated carboxylic acid ester compounds, unsaturated carboxylic acid amino alkyl ester compounds, carboxylic acid vinyl ester compounds, unsaturated carboxylic acid glycidyl ester compounds, vinyl cyanide compounds, unsaturated amide compounds, and the like, and combinations thereof.

Representative examples of the alkenyl aromatic monomer may include without limitation styrene, α-methyl styrene, vinyl toluene, vinyl benzyl methyl ether, and the like and combinations thereof. Representative examples of the unsaturated carboxylic acid ester compound may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like and combinations thereof. Representative examples of the unsaturated carboxylic acid amino alkyl ester compound may include without limitation 2-amino ethyl acrylate, 2-amino ethyl methacrylate, 2-dimethyl amino ethyl acrylate, 2-dimethyl amino ethyl methacrylate, and the like and combinations thereof. Representative examples of the carboxylic acid vinyl ester compounds may include without limitation vinyl acetate, vinyl benzoate, and the like and combinations thereof. Representative examples of the unsaturated carboxylic acid glycidyl ester compounds may include without limitation glycidyl acrylate, glycidyl methacrylate, and the like and combinations thereof. Representative examples of the vinyl cyanide compounds may include without limitation acrylonitrile, methacrylonitrile, and the like and combinations thereof. Representative examples of the unsaturated amide compounds may include without limitation acrylamide, methacrylamide, and the like and combinations thereof. The above-described representative examples are not limited thereto. Such a second ethylenic unsaturated monomer may be used alone or in combination of two or more thereof.

Examples of the acrylic binder resin including the first ethylenic unsaturated monomer and the second ethylenic unsaturated monomer may include without limitation methacrylic acid/benzyl methacrylate copolymers, methacrylic acid/benzyl methacrylate/styrene copolymers, methacrylic acid/benzyl methacrylate/2-hydroxy ethyl methacrylate copolymers, and methacrylic acid/benzyl methacrylate/styrene/2-hydroxy ethyl methacrylate copolymers, and the like. These compounds may be used alone or in combination of two or more thereof.

The acrylic binder resin can have a weight average molecular weight (Mw) ranging from about 3,000 g/mol to about 150,000 g/mol, for example from about 5,000 g/mol to about 50,000 g/mol. When the weight average molecular weight of the acrylic binder resin is within this range, the composition can exhibit excellent adhesion with respect to the substrate, excellent physical and chemical properties, appropriate viscosity, and excellent dispersibility.

The acrylic binder resin is the most influential factor to pixel resolution of the photosensitive resin composition. For example, a methacrylic acid/benzyl methacrylate copolymer can significantly affect pixel resolution due to the acid value and weight average molecular weight thereof.

The photosensitive resin composition may include the acrylic binder resin in an amount of about 1 wt % to about 20 wt %, based on the total weight (100 wt %) of the photosensitive resin composition. In some embodiments, the photosensitive resin composition may include the acrylic binder resin in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic binder resin can be in a range from about any of the foregoing amounts to about any other of the foregoing amounts.

When the photosensitive resin composition includes the acrylic binder resin in an amount within the above range, the composition can exhibit excellent adhesion with respect to the substrate, ensure a uniform film thickness, and provide excellent post-process properties of the color filter, such as film strength, heat resistance, chemical resistance, afterimage, and the like. Further, the composition can have excellent surface smoothness due to suitable cross-linking.

(C) Photopolymerizable Compound

The photopolymerizable compound may be selected from among photopolymerizable monomers, oligomers thereof and combinations thereof.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, pentaerythritol penta(meth)acrylate, pentaerythritol hexa(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, trimethylol propane tri(meth)acrylate, novolac epoxy(meth)acrylate, dipentaerythritol penta(meth)acrylate derivatives having a carboxyl group, ethylene oxide glycerine trimethylol propane tri(meth)acrylate, propylene oxide glycerine tri(meth)acrylate, and the like. These may be used alone or in combination of two or more thereof.

Examples of the photopolymerizable oligomer may include without limitation oligomers disclosed in "Present and prospect of UV/EB Radiation Curing Technology", RadTech Japan, CMC books, January 2003, such as epoxy (meth)acrylate, urethane(meth)acrylate, polyester(meth) acrylate, and the like, and combinations thereof.

Since the photopolymerizable monomer and/or oligomer tend to enhance solvent resistance through reaction with a cyclic ether, it is advantageous for the photopolymerizable monomer and/or oligomer to include a carboxyl group. Examples of the photopolymerizable monomer and/or oligomer having a carboxyl group may include without limitation esters of a hydroxyl group-containing (meth)acrylate and a polyvalent carboxylic acid, esters of a hydroxyl group-containing (meth)acrylate and a polyvalent carboxylic anhydride, and the like, and combinations thereof.

Examples of the hydroxyl group-containing (meth)acrylate may include without limitation trimethylol propane di(meth)acrylate, glycerine di(meth)acrylate, pentaerythritol tri(meth)acrylate, dipentaerythritol penta(meth)acrylate, and the like, and combinations thereof.

Examples of the polyvalent carboxylic acid may include without limitation aromatic polyvalent carboxylic acids, such as phthalic acid, 3,4-dimethylphthalic acid, isophthalic acid, terephthalic acid, pyromellitic acid, trimellitic acid, 1,4,5,8-naphthalene tetracarboxylic acid, 3,3',4,4'-benzophenone tetracarboxylic acid, and the like; aliphatic polyvalent carboxylic acids, such as succinic acid, glutaric acid, adipinic acid, 1,2,3,4-butanetetracarboxylic acid, maleic acid, fumaric acid, itaconic acid, and the like; cycloaliphatic polyvalent carboxylic acids, such as hexahydrophthalic acid, 3,4-dimethyltetrahydrophthalic acid, hexahydroisophthalic acid, hexahydroterephthalic acid, 1,2,4-cyclopentane tricarboxylic acid, 1,2,4-cyclohexane tricarboxylic acid, cyclopentane tetracarboxylic acid, 1,2,4,5-cyclohexane, tetracarboxylic acid, and the like, and combinations thereof.

Examples of the polyvalent carboxylic anhydride may include without limitation aromatic polyvalent carboxylic anhydrides, such as phthalic anhydride, pyromellitic anhydride, trimellitic anhydride, 3,3',4,4'-benzophenone tetracarboxylic dianhydride, and the like; aliphatic polyvalent carboxylic anhydrides, such as itaconic anhydride, succinic anhydride, citraconic anhydride, dodecenylsuccinic anhydride, tricarballylic anhydride, maleic anhydride, 1,2,3,4-butanetetracarboxylic dianhydride, and the like; cycloaliphatic polyvalent carboxylic anhydrides, such as hexahydrophthalic anhydride, 3,4-dimethyltetrahydrophthalic anhydride, 1,2,4-cyclopentane tricarboxylic anhydride, 1,2,4-cyclohexane tricarboxylic anhydride, cyclopentane tetracarboxylic dianhydride, 1,2,4,5-cyclohexane tetracarboxylic dianhydride, himic anhydride, and the like; ester group containing carboxylic anhydrides, such as ethylene glycol bis-(anhydro trimellitate), glycerol tris-(anhydro tritrimelitate), and the like, and combinations thereof.

Accordingly, examples of the carboxyl group-containing monomers and/or oligomers may include without limitation phthalic acid ester of trimethylol propane di(meth)acrylate, succinic acid ester of glycerine di(meth)acrylate, phthalic acid ester of pentaerythritol tri(meth)acrylate, succinic acid ester of pentaerythritol triacrylate, phthalic acid ester of dipentaerythritol penta(meth)acrylate, succinic acid ester of dipentaerythritol penta(meth)acrylate, and the like, and combinations thereof.

The photosensitive resin composition can include the photopolymerizable compound in an amount of about 1 wt % to about 20 wt %, for example about 3 wt % to about 15 wt %, based on the total weight (100 wt %) of the photosensitive resin composition. In some embodiments, the photosensitive resin composition can include the photopolymerizable compound in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable compound can be in a range from about any of the foregoing amounts to about any other of the foregoing amounts.

When the photosensitive resin composition includes the photopolymerizable compound in an amount within this range, the composition can exhibit sufficient degree of curing, excellent reliability, appropriate viscosity, and excellent stability over time.

(D) Photoinitiator

The photoinitiator can include a photoinitiator generally used in a photosensitive resin composition. Examples of the photoinitiator may include without limitation triazine compounds, acetophenone compounds, biimidazole compounds, benzoin compounds, benzophenone compounds, thioxanthone compounds, oxime compounds, and the like, and combinations thereof.

Examples of the triazine compound may include without limitation 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfurane-2-yl)ethenyl]-1,3,5-triazine, 2,4-bis(trichloromethyl)-6-[2-(furane-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, 2,4-bis(trichloromethyl)-6-piperonyl)-1,3,5-triazine, 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphtho 1-yl)-4,6-bis(trichloro methyl)-s-triazine, 2-(4-methoxy naphtho 1-yl)-4,6-bis(trichloro methyl)-s-triazine, 2-4-trichloro methyl (piperonyl)-6-triazine, 2-4-trichloro methyl(4'-methoxy styryl)-6-triazine, and the like and combinations thereof. In exemplary embodiments, 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine and/or 2,4-bis(trichloromethyl)-6-piperonyl-1,3,5-triazine, for example 2,4-bis(trichloromethyl)-6-piperonyl-1,3,5-triazine may be used.

Examples of the acetophenone compound may include without limitation diethoxyacetophenone, 2-methyl-2-morpholino-1-(4-methylthiophenyl)propane-1-one, 2-hydroxy-2-methyl-1-phenylpropane-1-one, benzyl dimethylketal, 2-hydroxy-2-methyl-1-[4-(2-hydroxyethoxy)phenyl]propane-1-one, 1-hydroxycyclohexylphenylketone, 2-benzyl-2-dimethylamino-1-(4-morpholinophenyl)butane-1-one, 2-(4-methylbenzyl)-2-dimethylamino-1-(4-morpholinophenyl) butane-1-one, 2-hydroxy-2-methyl-1-[4-(1-methylvinyl) phenyl]propane-1-one, and the like and combinations thereof. In exemplary embodiments, 2-methyl-2-morpholino-1-(4-methylthiophenyl)propane-1-one, 2-benzyl-2-dimethylamino-1-(4-morpholinophenyl)butane-1-one and/or 2-(4-methylbenzyl)-2-dimethylamino-1-(4-morpholinophenyl)butane-1-one, for example 2-benzyl-2-dimethylamino-1-(4-morpholinophenyl)butane-1-one and/or 2-(4-methylbenzyl)-2-dimethylamino-1-(4-morpholinophenyl)butane-1-one may be used.

Examples of the biimidazole compound may include without limitation 2,2'-bis(2-chlorophenyl)-4,4',5,5'-tetraphenyl biimidazole, 2,2'-bis(2-chlorophenyl)-4,4',5,5'-tetra(4-carboethoxyphenyl)biimidazole, 2,2'-bis(2-chlorophenyl)-4,4',5,5'-tetra(4-bromophenyl)biimidazole, 2,2'-bis(2-chlorophenyl)-4,4',5,5'-tetra(2,4-dichlorophenyl)biimidazole, 2,2'-bis(2-bromophenyl)-4,4',5,5'-tetraphenylbiimidazole, 2,2'-bis(2,4-dichlorophenyl)-4,4',5,5'-tetraphenylbiimidazole, 2,2'-bis(2-chlorophenyl)-4,4',5,5'-tetra(m-methoxyphenyl) biimidazole, 2,2'-bis(2,3-dichlorophenyl)-4,4',5,5'-tetraphenylbiimidazole, 2,2'-bis(2,6-dichlorophenyl)-4,4',5,5'-tetraphenylbiimidazole, 2,2'-bis(2-nitrophenyl)-4,4',5,5'-tetraphenylbiimidazole, 2,2'-bis(2-methylphenyl)-4,4',5,5'-tetraphenylbiimidazole and the like and combinations thereof. In exemplary embodiments, 2,2'-bis(2-chlorophenyl)-4,4',5,5'-tetraphenylbiimidazole and/or 2,2'-bis(2,3-dichlorophenyl)-4,4',5,5'-tetraphenylbiimidazole may be used.

Examples of the benzoin compound may include without limitation benzoin, benzoin methylether, benzoin ethylether, benzoin isopropylether, benzoin isobutylether, benzyldimethylketal, and the like and combinations thereof.

Examples of the benzophenone compound may include without limitation benzophenone, benzoyl benzoate, methyl o-benzoyl benzoate, 4-phenyl benzophenone, hydroxy benzophenone, benzophenone acrylate, 3,3'-dimethyl-2-methoxy benzophenone, 4,4'-dichloro benzophenone, 4,4'-bis(dimethylamino)benzophenone, 4,4'-bis(diethylamino) benzophenone, 4-benzoyl-4'-methyldiphenylsulfide, 3,3',4, 4'-tetra(tert-butylperoxycarbonyl)benzophenone, 2,4,6-trimethylbenzophenone, and the like and combinations thereof.

Examples of the thioxanthone compound may include without limitation thioxanthone, 2-methyl thioxanthone, 2-isopropyl thioxanthone, 4-isopropyl thioxanthone, 2,4-diethyl thioxanthone, 2,4-diisopropyl thioxanthone, 2-chlorothioxanthone, 1-chloro-4-propoxythioxanthone, and the like and combinations thereof.

Examples of the oxime compound may include without limitation O-acyloxime compounds, 1,2-octanedione, 2-(O-benzoyloxime)-1-[4-(phenylthio)phenyl]-1,2-octanedione, 1-(O-acetyloxime)-1-[9-ethyl-6-(2-methylbenzoyl)-9H-carbazole-3-yl]ethanone, O-ethoxycarbonyl-α-oxyamino-1-phenylpropane-1-one, and the like and combinations thereof. Examples of the O-acyloxime compound may include without limitation 1-(4-phenylsulfanylphenyl)-butane-1,2-dione2-oxime-O-benzoate, 1-(4-phenylsulfanylphenyl)-octane-1,2-dione2-oxime-O-benzoate, 1-(4-phenylsulfanylphenyl)-octane-1-oneoxime-O-acetate, 1-(4-phenylsulfanylphenyl)-butane-1-oneoxime-O-acetate and the like, and combinations thereof.

Besides the aforementioned compounds, 2,4,6-trimethylbenzoyl diphenylphosphine oxide, 10-butyl-2-chloroacridone, 2-ethylanthraquinone, 9,10-phenanthrenequinone, camphorquinone, methyl phenylglyoxylate, titanocene compounds, and the like and combinations thereof may also be used.

Further, the photoinitiator may be used together with a photosensitizer causing chemical reaction by transferring energy after excitation by absorbing light.

The photosensitive resin composition may include the photoinitiator in an amount of about 0.1 wt % to about 5 wt % based on the total weight (100 wt %) of the photosensitive resin composition. In some embodiments, the photosensitive resin composition may include the photoinitiator in an amount of about 0.1, 0.2, 0.3, 0.4, 0.5, 0.6, 0.7, 0.8, 0.9, 1, 2, 3, 4, or 5 wt %. Further, according to some embodiments of the present invention, the amount of the photoinitiator can be in a range from about any of the foregoing amounts to about any other of the foregoing amounts.

When the photosensitive resin composition includes the photoinitiator in an amount within this range, the composition can be sufficiently polymerized in the course of pattern forming process, and may not cause any reduction in transmittance due to the residual unreacted initiator after polymerization.

(E) Solvent

The solvent may have compatibility with the acrylic binder resin and other constitutional components without reacting with the components.

Examples of the solvent may include without limitation alcohols, such as methanol, ethanol, and the like; ethers, such as dichloroethyl ether, n-butyl ether, diisoamyl ether, methylphenyl ether, tetrahydrofurane, and the like; glycol ethers, such as ethylene glycol monomethyl ether, ethylene glycol monoethyl ether, and the like; cellosolve acetates, such as methyl cellosolve acetate, ethyl cellosolve acetate, diethyl cellosolve acetate, and the like; carbitols, such as methylethyl carbitol, diethyl carbitol, and the like; diethylene glycol alkyl ether, such as diethylene glycol monomethyl ether, diethylene glycol monoethyl ether, diethylene glycol dimethyl ether, diethylene glycol methylethyl ether, diethylene glycol diethyl ether, and the like; propylene glycol alkyl ether acetates, such as propylene glycol methyl ether acetate, propylene glycol propyl ether acetate, and the like; aromatic hydrocarbons, such as toluene, xylene, and the like; ketones, such as methylethylketone, cyclohexanone, 4-hydroxy-4-methyl-2-pentanone, methyl-n-propyl ketone, methyl-n-butylketone, methyl-n-amylketone, 2-heptanone, and the like; saturated aliphatic alkyl monocarboxylate esters, such as ethyl acetate, n-butyl acetate, isobutyl acetate, and the like; lactate esters such as methyl lactate, ethyl lactate, and the like; alkyl oxyacetate esters, such as methyl oxyacetate, ethyl oxyacetate, butyl oxyacetate, and the like; alkyl alkoxyacetate esters, such as methyl methoxyacetate, ethyl methoxyacetate, butyl methoxyacetate, methyl ethoxyacetate, ethyl ethoxyacetate, and the like; alkyl 3-oxypropionate esters, such as methyl 3-oxypropionate, ethyl 3-oxypropionate, and the like; alkyl 3-alkoxypropionate esters, such as methyl 3-methoxypropionate, ethyl 3-methoxypropionate, ethyl 3-ethoxy propionate, methyl 3-ethoxypropionate, and the like; alkyl 2-oxypropionate esters, such as methyl 2-oxypropionate, ethyl 2-oxypropionate, propyl 2-oxypropionate, and the like; alkyl 2-alkoxypropionate esters, such as methyl 2-methoxypropionate, ethyl 2-methoxypropionate, ethyl 2-ethoxypropionate, methyl 2-ethoxypropionate, and the like; alkyl monooxy monocarboxylate esters including alkyl 2-oxy-2-methylpropionates, such as methyl 2-oxy-2-methylpropionate and ethyl 2-oxy-2-methylpropionate, and alkyl 2-alkoxy-2-methylpropionate, such as methyl 2-methoxy-2-methylpropionate and ethyl 2-ethoxy-2-methylpropionate; esters, such as ethyl 2-hydroxypropionate, ethyl 2-hydroxy-2-methylpropionate, ethyl hydroxylacetate, and methyl 2-hydroxy-3-methylbutyrate; ketonate esters, such as ethyl pyruvate, and the like and combinations thereof. Examples of the solvent may additionally include high-boiling point solvents, such as but not limited to N-methylformamide, N,N-dimethylformamide, N-methylformanilide, N-methylacetamide, N,N-dimethylacetamide, N-methylpyrrolidone, dimethylsulfoxide, benzylethyl ether, dihexyl ether, acetonylacetone, isophorone, capronic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and/or phenylcellosolve acetate.

In view of compatibility and reactivity of the solvent, among the aforementioned solvents, glycol ethers, such as ethylene glycol monomethyl ether; ethylene glycol alkyl ether acetates, such as ethyl cellosolve acetate; esters, such as ethyl 2-hydroxy propionate; diethylene glycols, such as diethylene glycol monomethyl ether; and/or propylene glycol alkyl ether acetates, such as propylene glycol methyl ether acetate, and propylene glycol propyl ether acetate may be used. In view of solubility of the dye, cyclohexaone may be present in an amount of about 10 wt % to about 80 wt % in the total solvent.

The solvent may be used in the balance amount with respect to the total amount of the photosensitive resin composition such that solubility and viscosity of the composition can be suitably adjusted after addition of other components, and such that physical and optical properties can be enhanced upon application to products.

(F) Other Additive(s)

Optionally, the photosensitive resin composition may further include a nonionic, anionic and/or cationic dispersant to improve dispersibility of the colorant.

Examples of the dispersant may include without limitation polyalkylene glycols and esters thereof, polyoxyalkylene, polyhydric alcohol ester alkylene oxide adducts, alcohol alkylene oxide adducts, sulfonic acid esters, sulfonic acid salts, carboxylic acid esters, carboxylic acid salts, alkylamide alkylene oxide adducts, alkylamines, and the like. These can be used alone or in combination of two or more thereof.

The dispersant may be present in an amount of about 0.1 wt % to about 4 wt % based on the total weight (100 wt %) of the photosensitive resin composition.

The resin composition may further include a coating improver, such as a silicone coating improver and/or a fluorine coating improver, to enhance coatability and anti-foaming properties, and/or an adhesion promoter and the like, to enhance adhesion with a substrate, as needed.

The coating improver and/or the adhesion promoter may be present in an amount of about 0.01 wt % to about 1 wt % based on the total weight (100 wt %) of the photosensitive resin composition.

The composition may further include one or more additives, such as but not limited to epoxy compounds; malonic acid; 3-amino-1,2-propanediol; silane coupling agents having a vinyl group or a (meth)acryloxy group; leveling agents; silicone surfactants; fluorine surfactants; radical polymerization initiators, and the like, and combinations thereof in order to prevent spots and/or specks upon coating and/or to prevent generation of residues due to leveling property or non-development. The amount of additives used may be easily adjusted depending on desired physical properties.

Examples of the epoxy compound may include without limitation phenol novolac epoxy resins, tetramethyl biphenyl epoxy resins, bisphenol A type epoxy resins, cycloaliphatic epoxy resins, ortho-cresol novolac resins, and the like, and combinations thereof. The epoxy compound may be present in an amount of about 0.01 wt % to about 10 wt % based on the total weight (100 wt %) of the photosensitive resin composition. Within this range, the composition can exhibit excellent storage properties and process margin.

Examples of the silane coupling agent may include without limitation vinyl trimethoxysilane, vinyl tris(2-methoxyethoxysilane), 3-glysidoxypropyl trimethoxysilane, 2-(3,4-epoxy cyclohexyl)ethyl trimethoxysilane, 3-chloropropyl methyl dimethoxysilane, 3-chloropropyl trimethoxysilane, 3-methacryloxypropyl trimethoxysilane, 3-mercaptopropyl trimethoxysilane, and the like, and combinations thereof.

The silane coupling agent may be present in an amount of about 0.01 wt % to about 2 wt % based on the total weight (100 wt %) of the photosensitive resin composition. Within this range, the composition can exhibit excellent adhesion, storage properties, and coating ability.

Examples of the silicone surfactant may include without limitation surfactants having a siloxane bond. For example, commercially available silicone surfactants may include without limitation DC3PA, SH7PA, DC11PA, SH21PA, SH28PA, 29SHPA, and/or SH30PA (Toray Silicone Co., Ltd.); SH8400 (Toray Silicone Co., Ltd.), which is a polyester modified silicone oil; Shin-Etsu Silicone KP321, KP322, KP323, KP324, KP326, KP340, and/or GF (Shin-Etsu Chemical Co., Ltd.); TSF4445, TSF4446, TSF4452, and/or TSF4460 (Toshiba Silicone Co., Ltd.), and the like, and combinations thereof.

Examples of the fluorine surfactant may include without limitation surfactants having a fluorocarbon chain, and the like. For example, commercially available fluorine surfactants may include without limitation Fluorad FC430 and/or Fluorad FC431, manufactured by Sumitomo 3M Ltd.; MEGAFAC F142D, MEGAFAC F171, MEGAFAC F172, MEGAFAC F173, MEGAFAC F177, MEGAFAC F183, MEGAFAC F470, MEGAFAC F475, and/or MEGAFAC R30 (Dainippon Ink and Chemicals, Inc.); Efftop EF301, Efftop EF303, Efftop EF351, and/or Efftop EF352 (Shinakida Kasei Co., Ltd.); Saffron S381, Saffron S382, Saffron SC101, and/or Saffron SC105 (Asahi Glass Co., Ltd.); E5844 (Daikin Fine Chemical Laboratory Co., Ltd.), and the like, and combinations thereof.

Such silicone surfactants and/or fluorine surfactants may be used alone or in combination of two or more thereof.

A color filter according to one embodiment of the invention may be prepared using the photosensitive resin composition according to one embodiment of the present invention.

For example, the photosensitive resin composition can be coated to a thickness of about 1.5 μm to about 3.5 μm to a glass substrate to which nothing is applied and/or to a glass substrate on which SiNx (protection membrane) is applied to a thickness of about 500 Å to about 1,500 Å by a suitable method, such as spin coating, slit coating, and the like. After coating, the composition can be subjected to soft-baking at about 90° C., followed by irradiating an active radiation to form a pattern for color filters. As a light source for irradiation, for example, UV light in the range of about 190 nm to about 450 nm, for example about 200 nm to about 400 nm, can be used. Electron beams and/or X-ray irradiation are also suitable. After irradiation, the coated layer can be treated with an alkali developing solution to dissolve the non-irradiated area of the coated layer, thereby forming a pattern needed for color filters. The above procedure may be repeated in accordance with number of desired colors, thereby obtaining a color filter having a desired pattern.

Now, the present invention will be described in more detail with reference to the following examples. However, it should be noted that these examples are provided for illustration only and are not to be construed in any way as limiting the present invention.

PREPARATIVE EXAMPLES 1 TO 4

Preparation of Dye

Preparation 1

First Step: Preparation of methyl 4-(2,3,6-trichloro-4,5-dicyano-phenoxy)benzoate To a 250 mL flask, 4.8 g of tetrachlorophthalonitrile, 3.98 g of methyl 4-hydroxybenzoate, 5 g of potassium carbonate ($K_2CO_3$), and 55 mL of acetonitrile are added, followed by heating for 12 hours while refluxing. After completion of the reaction, 30 mL of ethyl acetate is added and filtered to remove the solvent. To the obtained solid, a suitable amount of dichloromethane is added to dissolve the solid, followed by adding hexane for crystallization. The obtained solid is filtered and dried under vacuum to obtain a compound, methyl 4-(2,3,6-trichloro-4,5-dicyano-phenoxy)benzoate. The first step reaction may be represented by Reaction Scheme 1:

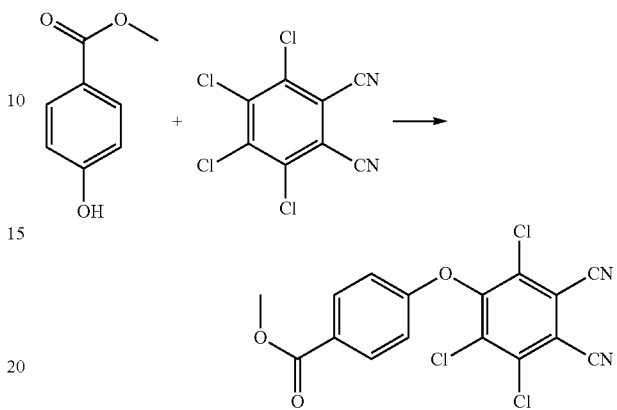

Second Step: Preparation of 4-[(biphenyl-2-yl)oxy]-3,5,6-trichlorophthalonitrile To a 250 mL flask, 4.8 g of tetrachlorophthalonitrile, 4.3 g of biphenyl-2-ol, 5 g of potassium carbonate (K2CO3) and 55 mL of acetonitrile are added, followed by heating for 12 hours while refluxing. After completion of the reaction, 30 mL of ethyl acetate is added and filtered to remove the solvent. To the obtained solid, a suitable amount of dichloromethane is added to dissolve the solid, followed by adding hexane for crystallization. The obtained solid is filtered and dried under vacuum to obtain a compound, 4-[(biphenyl-2-yl)oxy]-3,5,6-trichlorophthalonitrile. The second step reaction may be represented by Reaction Scheme 2:

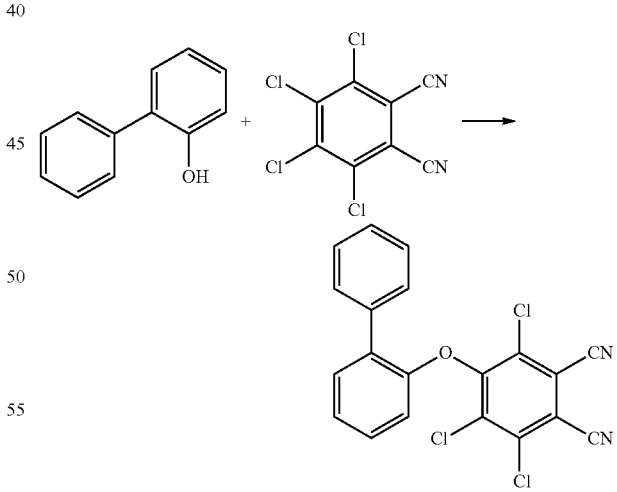

Third Step: Preparation of Phthalocyanine Compound

To a 500 mL flask, 3.0 g of methyl 4-(2,3,6-trichloro-4,5-dicyano-phenoxy)benzoate prepared in the first step, 7.0 g of 4-[(biphenyl-2-yl)oxy]-3,5,6-trichlorophthalonitrile prepared in the second step, 120 mL of pentanol, 8.5 g of DBU (diazabicycloundecene) and 1.5 g of zinc acetate are added, followed by heating for 18 hours while refluxing. After completion of the reaction, 150 ml of water is added and then filtered. To the obtained solid, a suitable amount of dichloromethane is added to dissolve the solid, followed by adding hexane for crystallization. The obtained solid is filtered and dried under vacuum to obtain a phthalocyanine compound represented by Formula 8.

conduct neutralization. Thereafter, the resultant is washed with water several times. The obtained product solution is subjected to solvent removal treatment. To the obtained solid, a small amount of ethyl acetate is added to dissolve the solid, followed by adding dichloromethane for crystallization. The obtained solid is filtered, dried under vacuum to obtain a hydrolyzed compound of phthalocyanine containing a carboxylic acid represented by Formula 9.

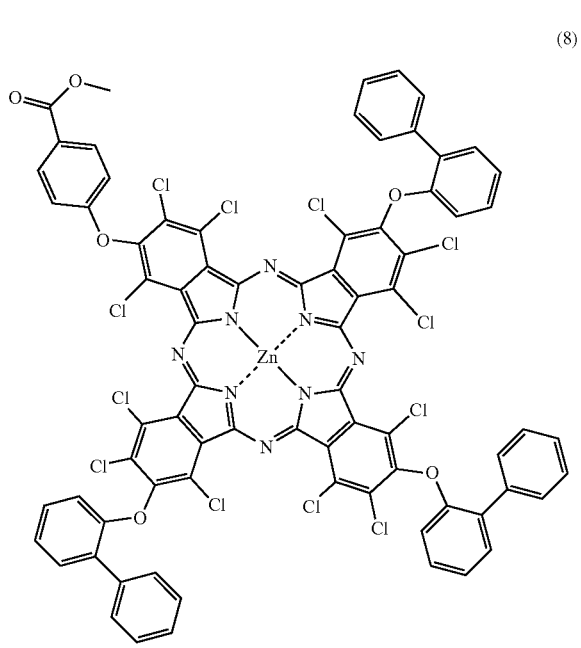

(8)

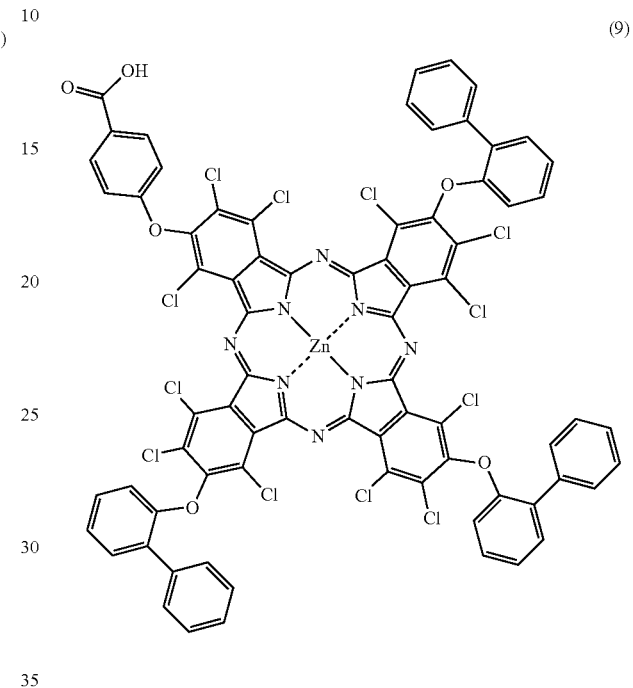

(9)

Fourth Step: Preparation of Hydrolyzed Compound of Phthalocyanine

To a 500 mL flask, 23 g of tetrahydrofurane (THF), 159 g of methanol and 46 g of water are added, followed by adding and dissolving 10.0 g of phthalocyanine compound prepared in the third step. To the resultant solution, 30 g of sodium hydroxide is added, followed by heating for 12 hours while refluxing. After cooling to room temperature, the solution is washed twice with 20 mL of dichloromethane. 50 mL of ethylacetate is added to an aqueous layer, followed by slowly adding an aqueous dilute hydrochloric acid solution so as to Fifth Step: Preparation of Zn Complex of Phthalocyanine Compound To a 500 mL flask, 84 g of THF and 36 g of methanol are added, followed by adding and dissolving 9.0 g of a hydrolyzed compound of phthalocyanine containing a carboxylic acid obtained in the fourth step. To the resultant solution, 4.3 g of zinc acetate is added, followed by heating for 12 hours while refluxing. After cooling to room temperature, the resultant solid is filtered. To the obtained solid, methanol is added, and the undissolved product is filtered and dried under vacuum to obtain a Zn complex of phthalocyanine represented by Formula 10.

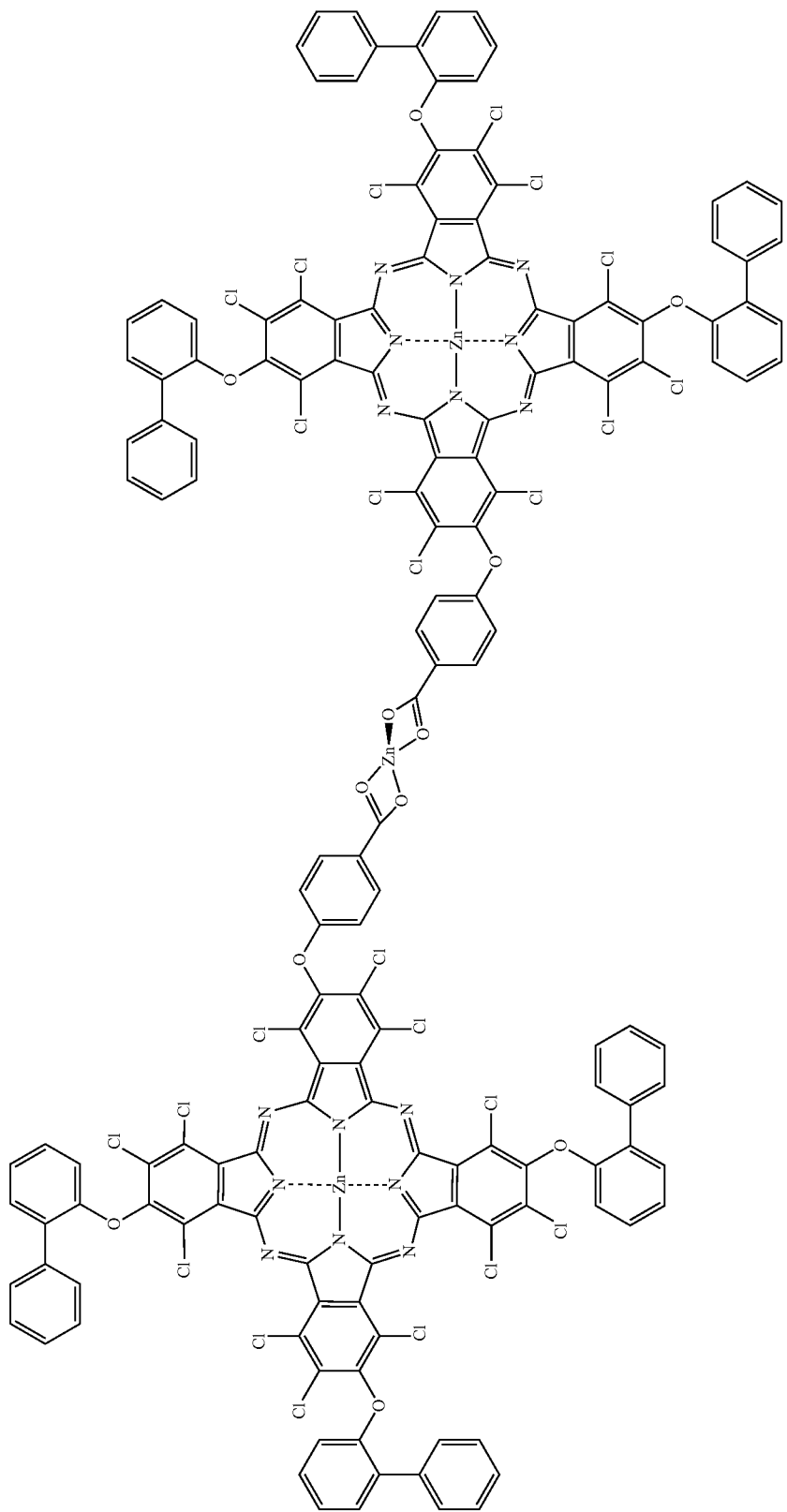

PREPARATIVE EXAMPLE 2

A Cu complex of phthalocyanine represented by Formula 11 is obtained in the same manner as in Preparative Example 1 except that 6.9 g of 2,6-diphenylphenol is used instead of biphenyl-2-ol in the second step, 1.2 g of magnesium acetate is used instead of zinc acetate in the third step, and 4.3 g of copper acetate is used instead of zinc acetate in the fifth step.

(11)

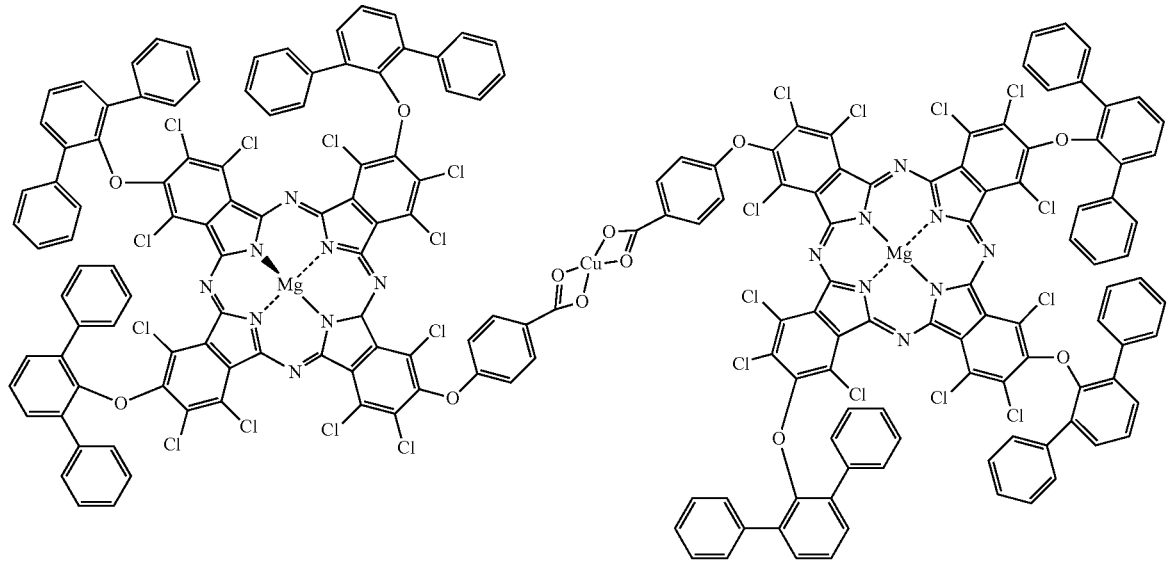

PREPARATIVE EXAMPLE 3

A Zn complex of phthalocyanine represented by Formula 12 is obtained in the same manner as in Preparative Example 1 except that 1.2 g of magnesium acetate is used instead of zinc acetate in the third step, the amount of methyl 4-(2,3,6-trichloro-4,5-dicyano-phenoxy)benzoate is changed from 3.0 g to 5.0 g, the amount of 4-[(biphenyl-2-yl)oxy]-3,5,6-trichlorophthalonitrile is changed from 7.0 g to 5.0 g.

(12)

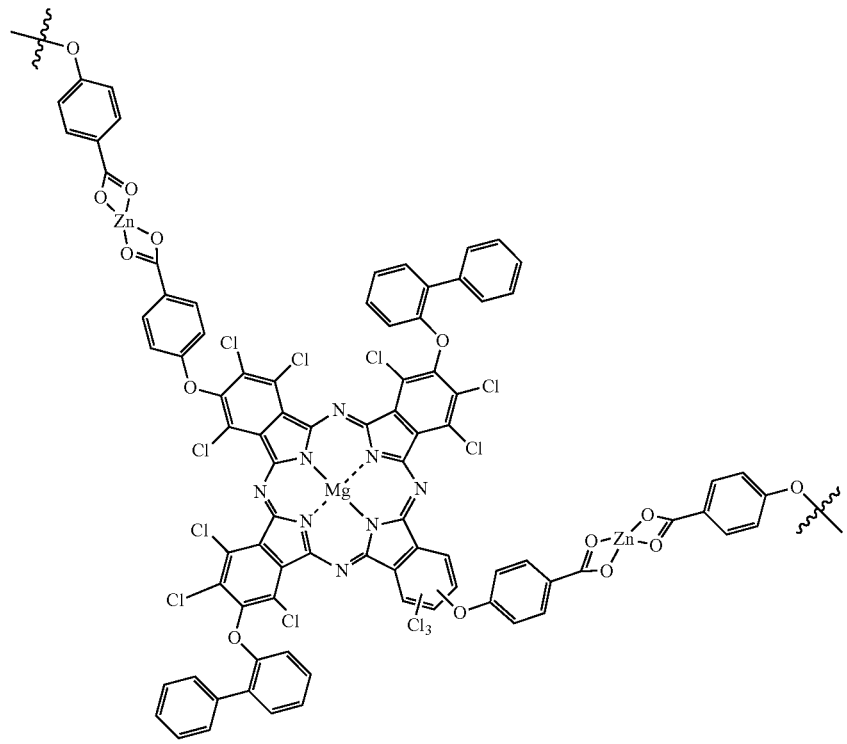

PREPARATIVE EXAMPLE 4

A Zn complex of phthalocyanine represented by Formula 13 is obtained by the same manner as in Preparative Example 1 except that 3.6 g of tetrafluorophthalonitrile is used instead of 4.8 g of tetrachlorophthalonitrile, and 1.8 g of 2-methyl-propan-2-ol is used instead of 4.3 g of biphenyl-2-ol in the second step, the amount of methyl 4-(2,3,6-trichloro-4,5-dicyano-phenoxy)benzoate is changed from 3.0 g to 5.0 g and 3.2 g of 4-tert-butoxy-3,5,6-trifluorophthalonitrile is used instead of 7.0 g of 4-[(biphenyl-2-yl)oxy]-3,5,6-trichlorophthalonitrile in the third step.

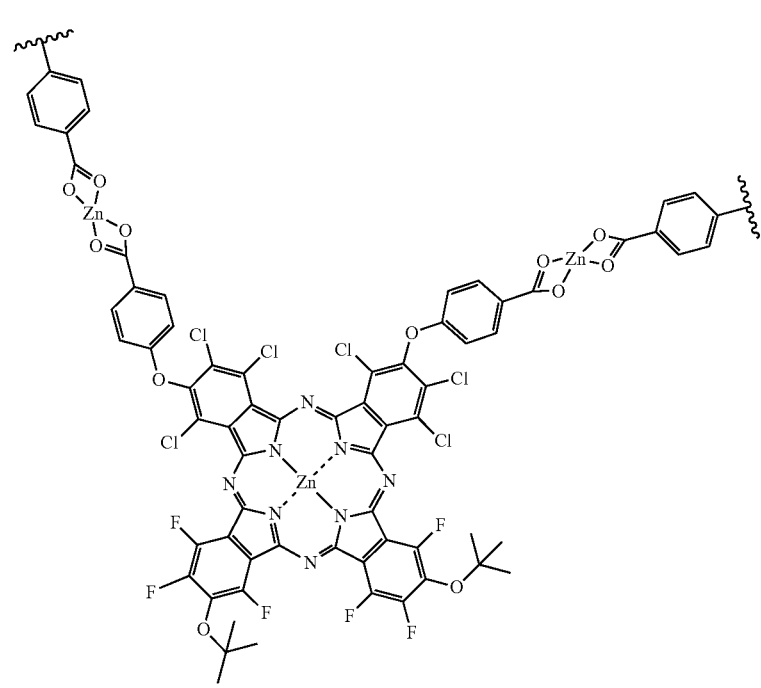

(13)

EXAMPLES 1 TO 4 AND COMPARATIVE EXAMPLES 1 TO 3

Preparation of Photosensitive Resin Composition

Photosensitive resin compositions are prepared by mixing components in the amounts listed in Table 1. Details of the components used in Examples and Comparative Examples are as follows:

(A) Colorant (a1) A Zn complex of phthalocyanine represented by Formula 10 prepared in Preparative Example 1 is used.

(a2) A Cu complex of phthalocyanine represented by Formula 11 prepared in Preparative Example 2 is used.

(a3) A Zn complex of phthalocyanine represented by Formula 12 prepared in Preparative Example 3 is used.

(a4) A Zn complex of phthalocyanine represented by Formula 13 prepared in Preparative Example 4 is used.

(a5) A phthalocyanine dye represented by Formula 14 is used.

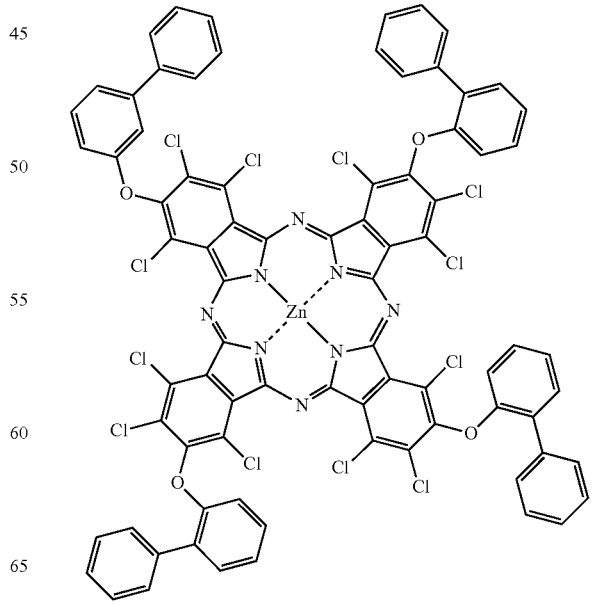

(14)

(a6) A dispersion (solid content: 22 wt %) of C.I. Pigment Yellow 138 is used.

(a7) A dispersion (solid content: 23 wt %) of C.I. Pigment Green 58 is used.

(a8) A dispersion (solid content: 25 wt %) of C.I. Pigment Green 36 is used.

(B) Acrylic Binder Resin

A methacrylic acid/benzylmethacrylate copolymer (Weight ratio 15:85) (Miwon Commercial Co., Ltd., NPR-1520) having a weight average molecular weight of 22,000 g/mol is used.

(C) Photopolymerizable Compound

Dipentaerythritol hexa(meth)acrylate (Nippon Kayaku Co., Ltd.) is used.

(D) Photoinitiator 1,2-octadione-1-(4-phenylthio)phenyl-2-(o-benzoyloxime) (Ciba Specialty Chemicals Inc., CGI-124) is used.

(E) Solvent (e1) Cyclohexanone is used.

(e2) Propylene glycol methyl ether acetate is used.

TABLE 1

|  |  | Example 1 | Example 2 | Example 3 | Example 4 | Comparative Example 1 | Comparative Example 2 | Comparative Example 3 |
|---|---|---|---|---|---|---|---|---|
| (A) Colorant | (a1) | 5 | — | — | — | — | — | — |
|  | (a2) | — | 5 | — | — | — | — | — |
|  | (a3) | — | — | 5 | — | — | — | — |
|  | (a4) | — | — | — | 5 | — | — | — |
|  | (a5) | — | — | — | — | — | — | 5 |
|  | (a6) | 15 | 15 | 15 | 15 | 15 | 15 | 15 |
|  | (b7) | — | — | — | — | 20 | — | — |
|  | (b8) | — | — | — | — | — | 20 | — |
| (B) Acrylic binder resin |  | 3.5 | 3.5 | 3.5 | 3.5 | 2.5 | 2.5 | 3.5 |
| (C) Photopolymerizable compound |  | 8 | 8 | 8 | 8 | 5 | 5 | 8 |
| (D) Photoinitiator | (e1) | 1 | 1 | 1 | 1 | 1 | 1 | 1 |
|  | (e2) | 0.5 | 0.5 | 0.5 | 0.5 | 0.5 | 0.5 | 0.5 |
| (E) Solvent | (f1) | 37 | 37 | 37 | 37 | 40 | 40 | 37 |
|  | (f2) | 30 | 30 | 30 | 30 | 16 | 16 | 30 |

(Unit: wt %)

Preparation of Color Specimen of the Photosensitive Resin Composition

The photosensitive resin compositions prepared in Examples 1 to 4 and Comparative Examples 1 to 3 are coated to a thickness of 1 μm to 3 μm onto a glass substrate having a size of 10×10 cm² by spin coating at 300 RPM, 400 RPM or 500 RPM, followed by pre-baking at 90° C. for 2 minutes. After cooling at room temperature for 1 minute, the coating is irradiated at 100 mJ/cm² (on the basis of 365 nm) to form thin films. After irradiation, the thin films are subjected to hard baking in a hot air dryer at 200° C. for 5 minutes to obtain cured thin films.

Evaluation of Physical Properties of the Photosensitive Resin Compositions (1) Measurement of Color and Luminance Spectroscopy is performed on the cured thin films on the glass substrate using a colorimeter (MCPD 3000: Otsuka Electronics Co., Ltd.) to obtain x and y color coordinates (Bx, By) and luminance (Y). Results obtained at target By=0.113 are shown in Table 2.

(2) Measurement of Contrast

Contrast of the cured thin films prepared as above is measured using a contrast tester (30,000:1, Tsubosaka Electric Co., Ltd.). Results are shown in Table 2.

(3) Evaluation of Heat Resistance

The cured thin films are dried in a hot air dryer at 230° C. for 30 minutes, followed by calculating ΔEab* based on color difference before and after treatment. ΔEab* of 3 or less indicates that the thin film has satisfactory reliability, and ΔEab* is inversely proportional to durability. Results are shown in Table 2.

TABLE 2

|  | Color coordinate | | Luminance | | Heat resistance |
|---|---|---|---|---|---|
|  | Bx | By | Y | Contrast | (ΔEab*) |
| Example 1 | 0.282 | 0.561 | 62.5 | 14,150 | 0.78 |
| Example 2 | 0.278 | 0.584 | 63.9 | 15,330 | 0.69 |
| Example 3 | 0.279 | 0.576 | 64.9 | 14,570 | 0.53 |
| Example 4 | 0.285 | 0.582 | 64.3 | 14,120 | 0.52 |
| Comparative Example 1 | 0.283 | 0.581 | 59.0 | 13,300 | 0.64 |
| Comparative Example 2 | 0.271 | 0.583 | 57.5 | 13,600 | 0.86 |
| Comparative Example 3 | 0.297 | 0.560 | 60.70 | 14,050 | 2.82 |

As shown in Table 2, the color filters prepared using the photosensitive resin composition of Examples 1 to 4 wherein the dye represented by Formula 1 is used exhibit better luminance, contrast and heat resistance than those of the color filters in Comparative Examples 1 and 2 wherein only pigment is used and Comparative Example 3 wherein the compound represented by Formula 14 is used as a dye.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims.

What is claimed is:

1. A photosensitive resin composition, comprising:
(A) a colorant including a dye represented by Formula 1;
(B) an acrylic binder resin;
(C) a photopolymerizable compound;
(D) a photoinitiator; and
(E) a solvent;

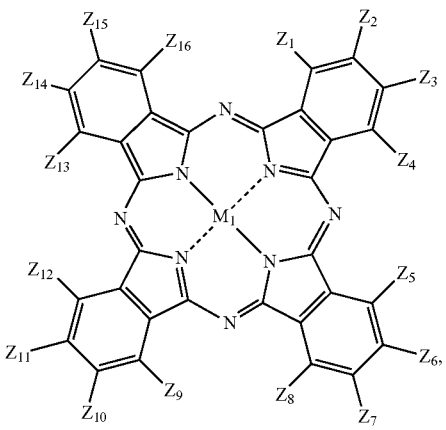

(1)

wherein $Z_1$ to $Z_{16}$ are the same or different and are each independently hydrogen, fluorine, chlorine, or one of Formulae 2 to 5, provided that 1 to 8 of $Z_1$ to $Z_{16}$ are substituted with one of Formulae 2 to 4 or a combination thereof; and $M_1$ is Zn, Mg, Ca, Sr, Ba, Mn, Co, Ni, Pd, Pt, Sn, Fe, InCl, or VCl,

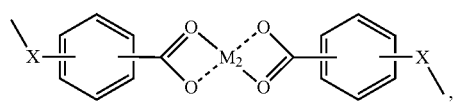

(2)

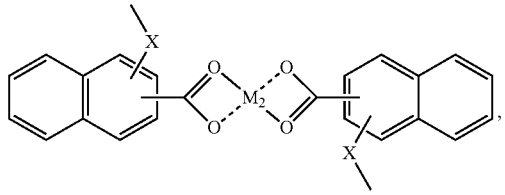

(3)

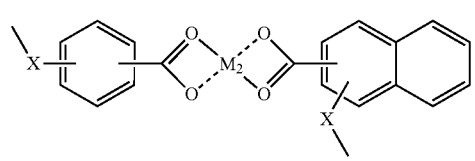

(4)

wherein each X is the same or different and is each independently oxygen (O), sulfur (S) or sulfone (—SO$_2$—); and $M_2$ is Zn, Mg, Ca, Sr, Ba, Mn, Co, Ni, Pd, Pt, Sn, Fe, InCl, or VCl,

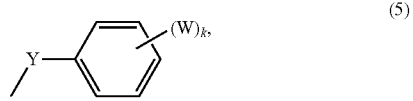

(5)

wherein Y is oxygen (O), sulfur (S) or sulfone (—SO$_2$—); each W is the same or different and each is independently substituted or unsubstituted $C_2$ to $C_{20}$ alkenyl, substituted or unsubstituted $C_3$ to $C_{20}$ alkynyl, substituted or unsubstituted $C_3$ to $C_{30}$ cycloalkyl, substituted or unsubstituted $C_3$ to $C_{30}$ cycloalkenyl, substituted or unsubstituted $C_6$ to $C_{30}$ cycloalkynyl, or substituted or unsubstituted $C_6$ to $C_{30}$ aryl; and k is 1 to 5.

2. The photosensitive resin composition according to claim 1, comprising:
(A) about 0.1 wt % to about 30 wt % of the colorant;
(B) about 1 wt % to about 20 wt % of the acrylic binder resin;
(C) about 1 wt % to about 20 wt % of the photopolymerizable compound;
(D) about 0.1 wt % to about 5 wt % of the photoinitiator; and
(E) the balance of the solvent.

3. The photosensitive resin composition according to claim 1, wherein the colorant further comprises at least one pigment comprising a green pigment, a yellow pigment, or a combination thereof in addition to the dye represented by Formula 1.

4. The photosensitive resin composition according to claim 3, wherein the colorant comprises the dye represented by Formula 1 and the pigment in a weight ratio of about 9:1 to about 1:9.

5. The photosensitive resin composition according to claim 1, wherein the dye is a compound represented by Formula 6, Formula 7, or a combination thereof:

(6)
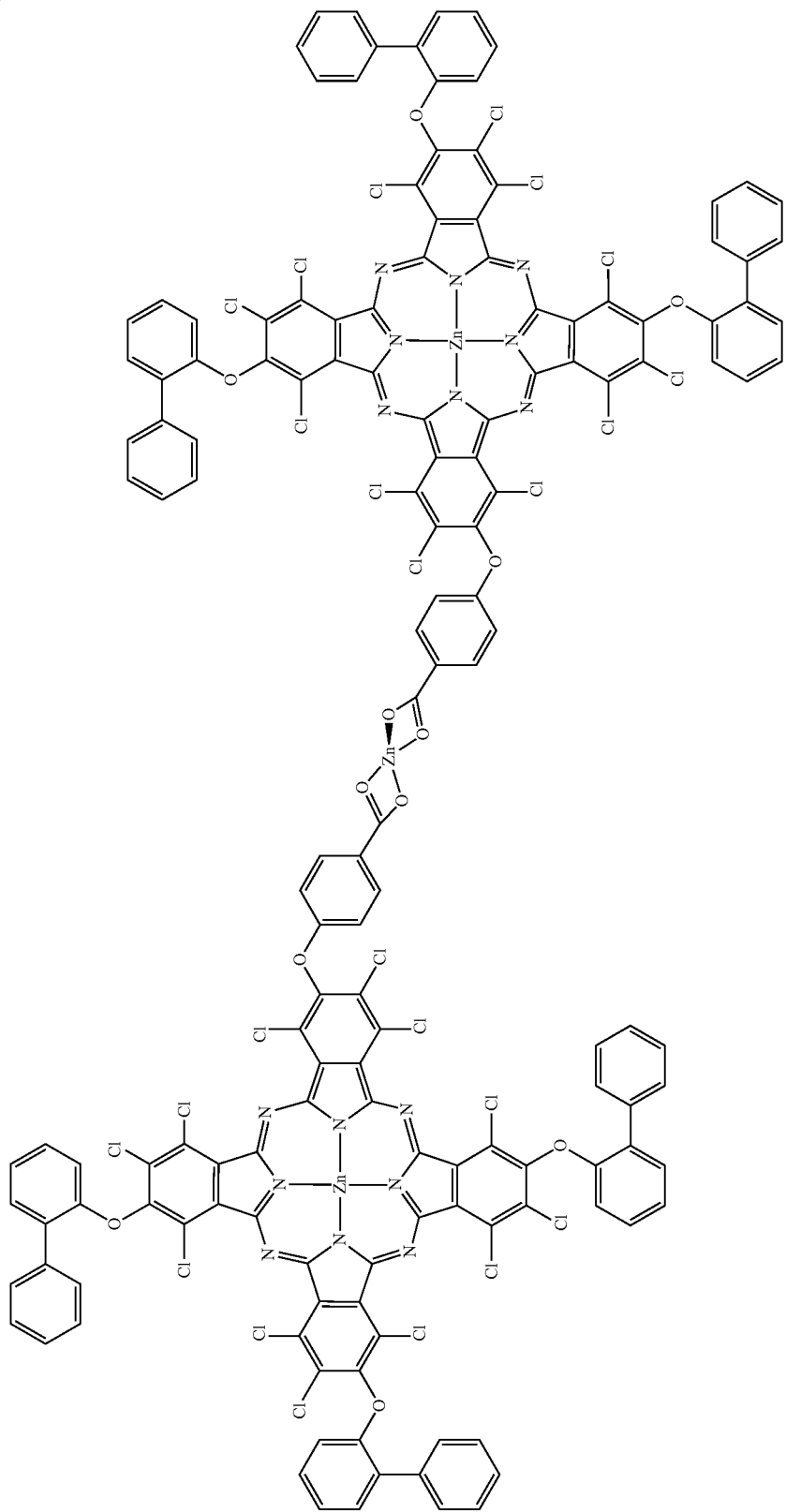

-continued
(7)
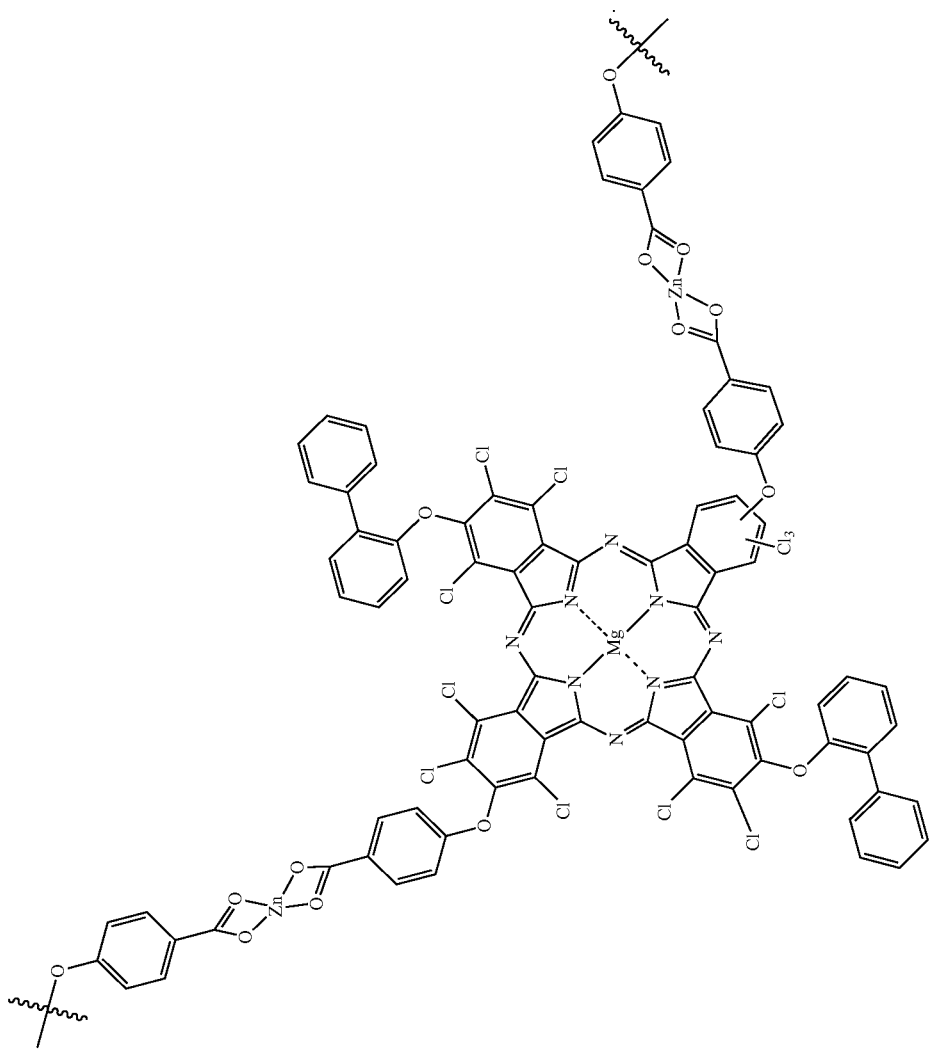

6. The photosensitive resin composition according to claim 1, wherein the acrylic binder resin (B) is a copolymer of a first ethylenic unsaturated monomer having at least one carboxyl group and a second ethylenic unsaturated monomer copolymerizable therewith.

7. The photosensitive resin composition according to claim 1, wherein the photopolymerizable compound (C) comprises ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenol A diacrylate, trimethylol propane triacrylate, novolac epoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, or a combination thereof.

8. The photosensitive resin composition according to claim 1, wherein the photoinitiator (D) comprises a triazine compound, acetophenone compound, benzophenone compound, thioxanthone compound, benzoin compound, oxime compound, or a combination thereof.

9. The photosensitive resin composition according to claim 1, further comprising: at least one additive selected from the group consisting of dispersants, coating improvers, adhesion promoters, silane coupling agents, leveling agents, surfactants, polymerization initiators, and combinations thereof.

10. A color filter prepared from the photosensitive resin composition according to claim 1.

11. The photosensitive resin composition according to claim 1, wherein 1 to 8 of $Z_1$ to $Z_{16}$ are substituted with Formula 2:

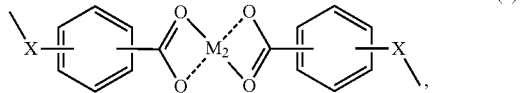

(2)

wherein each X is the same or different and is each independently oxygen (O), sulfur (S) or sulfone (—SO$_2$—); and M$_2$ is Zn, Mg, Ca, Sr, Ba, Mn, Co, Ni, Pd, Pt, Sn, Fe, InCl, or VCl.

12. The photosensitive resin composition according to claim 1, wherein 1 to 8 of $Z_1$ to $Z_{16}$ are substituted with Formula 3:

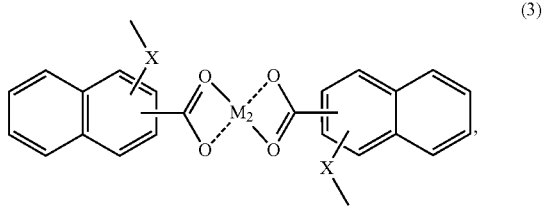

(3)

wherein each X is the same or different and is each independently oxygen (O), sulfur (S) or sulfone (—SO$_2$—); and M$_2$ is Zn, Mg, Ca, Sr, Ba, Mn, Co, Ni, Pd, Pt, Sn, Fe, InCl, or VCl.

13. The photosensitive resin composition according to claim 1, wherein 1 to 8 of $Z_1$ to $Z_{16}$ are substituted with Formula 4:

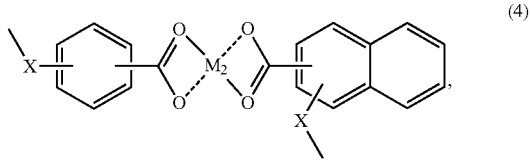

(4)

wherein each X is the same or different and is each independently oxygen (O), sulfur (S) or sulfone (—SO$_2$—); and M$_2$ is Zn, Mg, Ca, Sr, Ba, Mn, Co, Ni, Pd, Pt, Sn, Fe, InCl, or VCl.

* * * * *